United States Patent [19]

Breuninger et al.

[11] 4,097,685
[45] Jun. 27, 1978

[54] DISCRETE CROSSOVER CHIPS FOR INDIVIDUAL CONDUCTOR TRACK CROSSOVERS IN HYBRID CIRCUITS AND METHOD FOR CONSTRUCTING SAME

[75] Inventors: Karl Breuninger, Munich; Detlef Haberland, Wörthsee; Roland Herberger, Gottmadingen, all of Germany

[73] Assignee: Siemens Aktiengesellschaft, Munich, Germany

[21] Appl. No.: 730,285

[22] Filed: Oct. 6, 1976

[30] Foreign Application Priority Data

Oct. 17, 1975 Germany .............................. 2546736

[51] Int. Cl.² ...................... H05K 3/12; H01L 49/02
[52] U.S. Cl. ..................................... 174/68.5; 29/625
[58] Field of Search ........................................ 174/68.5

[56] References Cited

U.S. PATENT DOCUMENTS

| B 231,416 | 3/1976 | Marcantonio | 174/68.5 |
|---|---|---|---|
| 3,447,038 | 5/1969 | Liben | 174/68.5 |
| 3,801,388 | 4/1974 | Akiyama et al. | 174/68.5 |
| 3,806,629 | 4/1974 | Cocca | 174/68.5 |
| 3,816,195 | 6/1974 | Hebenstreet | 174/68.5 |

FOREIGN PATENT DOCUMENTS 1,245,972  9/1971  United Kingdom ............... 174/68.5

Primary Examiner—Bruce A. Reynolds
Assistant Examiner—John H. Bouchard
Attorney, Agent, or Firm—Schuyler, Birch, Swindler, McKie & Beckett

[57] ABSTRACT

A form of construction of and a method for fabricating individual conductor paths in hybrid circuits having conductor crossovers are described. Integrated circuit chips forming the crossovers are metallized so that at least the peripheral areas crosswise to the crossed conductor paths are free from metal.

2 Claims, 4 Drawing Figures

U.S. Patent
June 27, 1978
4,097,685
Fig. 1
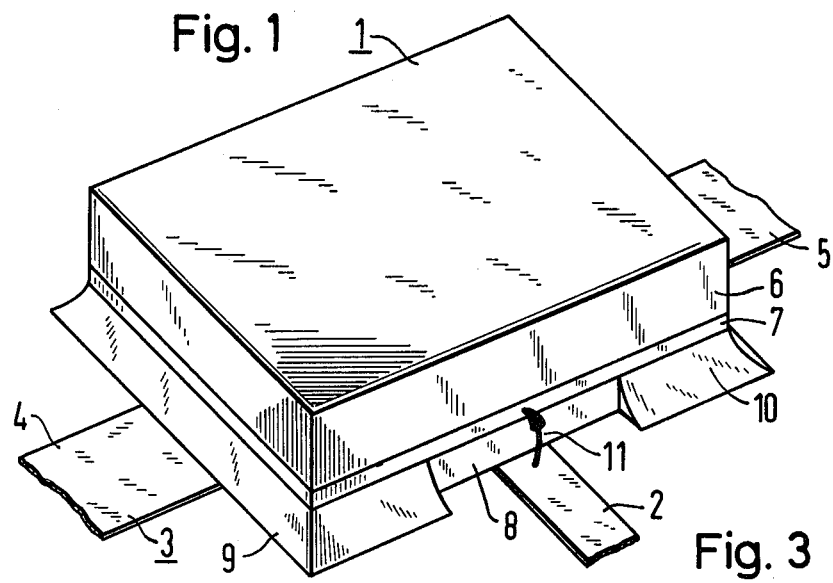
Fig. 2
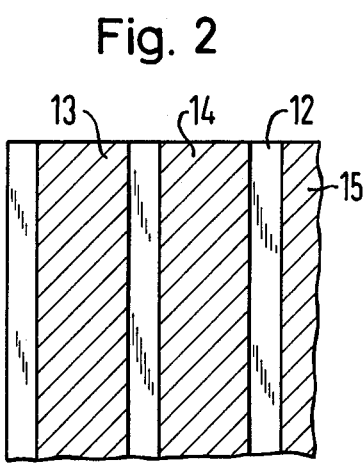
Fig. 3
Fig. 4
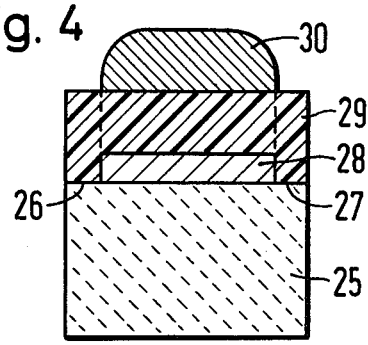

DISCRETE CROSSOVER CHIPS FOR INDIVIDUAL CONDUCTOR TRACK CROSSOVERS IN HYBRID CIRCUITS AND METHOD FOR CONSTRUCTING SAME

BACKGROUND OF THE INVENTION

The invention described herein relates to a form of construction of and a method for fabricating discrete crossover chips for individual conductor track crossovers in hybrid circuits having substrates metalcoated on a single side by thin-film technique, and wherein the metallized surface is coated with a photosensitive plastic coating composition which is discontinuous in at least two contact points due to solder nipples.

The crossover chips described herein and employed for realizing conductor track crossovers in thick or thin-film hybrid circuits all have a common feature, which is that the metallized coating of the chips terminates freely at the outer periphery. Such chips may be integrated in the circuits described hereinabove. However, when the voltage load is high, e.g., in excess of 400 volts, a Rocky Point effect may occur between chip and crossed-over track. The latter effect is commonly described as a transient, but violent, discharge or arc between electrodes.

Therefore, it is an object of the invention to improve the construction of the crossover chips described hereinabove such that the dielectric strength is substantially increased.

SUMMARY OF THE INVENTION

In accordance with the invention, the foregoing and other objects are achieved in that the crossover chips are so metallized that at least the peripheral areas crosswise to the crossed-over conductor track are free from metal and that the plastic coating composition is deposited such that it also surrounds the peripheral areas of the metal layer.

Thusly constructed crossover chips fully solve the problem addressed by the invention, as described above, and thus offer a greater margin of safety for the operation of the circuit. Moreover, according to a further design of the crossover chips according to the invention, their range of applicability is increased considerably. Thus, depending on the plastic coating composition employed, a high and permanent electric strength can be adjusted so as to rule out Rocky-Point effects.

To obtain the crossover chips designed according to the invention, a process will now be described which makes it economically feasible to fabricate such chips.

The process comprises at first depositing by thin-film technique strips of metal onto a substrate on a single side and parallel to one another except in the peripheral areas of the substrates extending parallel thereto. A film of photosensitive plastic coating composition is then deposited, and thereafter individual areas of the metal layer are freed from the plastic coating composition in a photolithographic process such that individual spots of metal are produced. The substrate is immersed in a solder bath, is then divided into individual substrates such that at least two spots of metal at a time provided with solder and electrically connected to one another by the metal deposited in the form of strips form one chip.

BRIEF DESCRIPTION OF THE DRAWINGS

The invention will now be described with reference to the drawings wherein:

FIG. 1 is a perspective view of a crossover chip integrated in a circuit and described hereinabove;

FIGS. 2 and 3 are cross-sectional views showing two production steps for obtaining the chips constructed according to the invention, and FIG. 4 is a cross-sectional view showing the crossover chip constructed by use of the process according to the principles of the invention.

DETAILED DESCRIPTION OF THE DRAWINGS

FIG. 1 shows a circuit of soldered-in crossover chips of known construction. The circuit includes two conductor tracks 2 and 3 extending at right angles to each other. The conductor track 3 consists of two sections 4 and 5, i.e., it is discontinuous. The crossover chip 1 consists of an $Al_2O_3$ substrate 6 which is provided with a metal layer 7 deposited in a holohedral form using thin-film techniques. An insulative layer 8 of plastic coating composition is deposited on the metal layer 7 except in two places where solders 9 and 10 are provided for bonding purposes.

Arrow 11 indicates the site where a Rocky-Point effect may occur between conductor track 2 and metal layer 7.

In order to obtain the crossover chip shown in FIG. 4 and designed in accordance with the teachings of the invention, very advantageous method of production will initially be discussed making reference to FIGS. 2 and 3.

FIG. 2 shows a substrate 12 provided with strips of metal 13, 14 and 15 in a manner in itself known, whereby in each case the areas between the strips and the two peripheral areas must be free of metal. As usual, an insulative layer of coating composition is then deposited in a photolighographic process (FIG. 3) except at locations 16 . . . 24, which produce spots of metal. After a dip soldering, whereby the spots of metal are provided with solder nipples (not shown) the substrate is cut - following the dashed line - into individual substrates which constitute the crossover chips. Thus, the top left rectangle shown in FIG. 3 and defined by the dashed lines is a crossover chip.

FIG. 4 shows the completed crossover chip constructed in accordance with the principles of the invention. As usual, it consists of an $Al_2O_3$ substrate 25 which, except in the peripheral areas 26 and 27, is provided with a metal layer 28. A film of plastic coating composition 29 is deposited over the metal layer and the peripheral areas for insulation purposes except in two places (not shown) which after the solder bath are provided with solder nipples (only one solder nipple 30 is shown).

The preferred embodiment of the invention, and the preferred method for fabricating it, described hereinabove should be considered only as being exemplary of the principles of the invention. The described embodiment and the described method can be modified or changed in a variety of ways known to those skilled in the art while remaining within the scope of the invention as defined by the appended claims.

We claim:

1. In a discrete, integrated circuit chip forming a conductor crossover wherein the integrated circuit comprises a substrate having a thin-film metal coating on one side, which metal coating is coated with a photosensitive plastic composition which is discontinuous in at least two points for solder points, the improvement comprising:

peripheral areas adjacent the crossover point of the conductor paths are free of the metal coating, the plastic coating surrounding said peripheral areas.

2. A method of fabricating a discrete, integrated circuit chip forming a conductor crossover wherein the integrated circuit comprises a substrate having a thin-film metal coating on one side, which metal coating is coated with a photosensitive plastic composition which is discontinuous in at least two points for solder points, comprising the steps of:

depositing parallel strips of metal on a single side of a substrate, except in the peripheral areas of said substrate parallel to said strips, coating the metal strip covered substrate with a photosensitive plastic, removing said plastic coating from predetermined portions of the metal strips by photolighography, immersing the layered substrate in a solder bath, and dividing the substrate into smaller portions such that each smaller portion has at least two of said predetermined portions of metal.

* * * * *